United States Patent
Kim et al.

(10) Patent No.: US 9,842,557 B2
(45) Date of Patent: Dec. 12, 2017

(54) GATE DRIVING CIRCUIT AND DISPLAY DEVICE HAVING THE SAME

(71) Applicant: Samsung Display Co., Ltd., Yongin, Gyeonggi-Do (KR)

(72) Inventors: Jonghee Kim, Yongin-si (KR); Youngwan Seo, Suwon-si (KR); Jaekeun Lim, Suwon-si (KR)

(73) Assignee: Samsung Display Co., Ltd. (KR)

( * ) Notice: Subject to any disclaimer, the term of this patent is extended or adjusted under 35 U.S.C. 154(b) by 31 days.

(21) Appl. No.: 14/961,672

(22) Filed: Dec. 7, 2015

(65) Prior Publication Data

US 2016/0210920 A1 Jul. 21, 2016

(30) Foreign Application Priority Data

Jan. 16, 2015 (KR) ........................ 10-2015-0008228

(51) Int. Cl.
*G09G 3/36* (2006.01)
*G11C 19/28* (2006.01)

(52) U.S. Cl.
CPC ......... *G09G 3/3677* (2013.01); *G11C 19/287* (2013.01); *G09G 2310/0286* (2013.01)

(58) Field of Classification Search
CPC ......... G09G 2310/0286; G09G 3/3648; G09G 2310/08
See application file for complete search history.

(56) References Cited

U.S. PATENT DOCUMENTS

| 8,666,019 B2 | 3/2014 | Shang |
| 2008/0055225 A1* | 3/2008 | Pak ...................... G09G 3/3677 345/96 |
| 2009/0040203 A1* | 2/2009 | Kim ...................... G09G 3/3677 345/204 |
| 2010/0158186 A1* | 6/2010 | Moon ...................... G11C 19/28 377/76 |
| 2014/0092078 A1 | 4/2014 | Yoon et al. |
| 2014/0267214 A1* | 9/2014 | Hwang ................ G09G 3/3648 345/212 |

FOREIGN PATENT DOCUMENTS

| KR | 10-1143531 | 5/2012 |
| KR | 10-1195440 | 10/2012 |
| KR | 10-1293559 | 8/2013 |
| KR | 10-1301500 | 8/2013 |
| KR | 10-1301556 | 9/2013 |

* cited by examiner

*Primary Examiner* — Md Saiful A Siddiqui
(74) *Attorney, Agent, or Firm* — Innovation Counsel LLP

(57) ABSTRACT

A gate driving circuit provides a plurality of gate lines of a display panel with gate signals, the gate driving circuit including: a plurality of driving stages which correspond to the plurality of gate lines, respectively, and each of which outputs a carry signal and a gate signal for driving a corresponding gate line in response to a clock signal, an input signal, and a carry signal of a next stage; and a dummy driving stage which outputs a dummy carry signal in response to the clock signal, a carry signal of the last stage of the plurality of driving stages, and a carry signal output from any one of the plurality of driving stages.

12 Claims, 10 Drawing Sheets

GATE DRIVING CIRCUIT AND DISPLAY DEVICE HAVING THE SAME

CROSS-REFERENCE TO RELATED APPLICATIONS

This U.S. non-provisional patent application claims priority to Korean Patent Application No. 10-2015-0008228, filed on Jan. 16, 2015, and all the benefits accruing therefrom under 35 U.S.C. §119, the entire contents of which are hereby incorporated by reference.

BACKGROUND

The present disclosure herein relates to a gate driving circuit and a display device having the same.

A display device includes a plurality of gate lines, a plurality of data lines, and a plurality of pixels connected to the plurality of gate lines and the plurality of data lines. The display device includes a gate driving circuit which provides the plurality of gate lines with gate signals, and a data driving circuit which outputs data signals to the plurality of data lines.

The gate driving circuit includes a shift register having a plurality of driving stage circuits (hereinafter, referred to as driving stages). The plurality of driving stages respectively output gate signals to the plurality of gate lines in one-to-one correspondence. Each of the plurality of driving stages includes a plurality of transistors which are interactively connected to each other.

SUMMARY

The invention provides a gate driving circuit having a reduced circuit area. The present disclosure also provides a display device which includes the gate driving circuit having a reduced circuit area.

Embodiments of the invention provide gate driving circuits which provides a plurality of gate lines of a display panel with gate signals, the gate driving circuit including: a plurality of driving stages which correspond to the plurality of gate lines, respectively, and each of which outputs a carry signal and a gate signal for driving a corresponding gate line in response to a clock signal, an input signal, and a carry signal of a next stage; and a dummy driving stage which outputs a dummy carry signal in response to the clock signal, a carry signal of the last stage of the plurality of driving stages, and a carry signal output from any one of the plurality of driving stages.

In these exemplary embodiments, the input signal provided to the plurality of stages may be a carry signal output from a previous stage, and the input signal provided to a first stage of the plurality of driving stages may be a vertical start signal.

In these exemplary embodiments, the carry signal of a next stage provided to the last stage of the plurality of driving stages may be the dummy carry signal output from the dummy driving stage.

In exemplary embodiments, when the number of the plurality of driving stages is n (n is a positive integer), the dummy stage may output the dummy carry signal in response to the clock signal, the carry signal of the last stage of the plurality of stages, and a carry signal output from an (n−1)-th driving stage.

In these embodiments, a k-th (k is a natural number of 2 or more) stage of the plurality of driving stages may include: a first output transistor including a gate electrode receiving an output control signal of a first node, an source electrode receiving the clock signal, and an drain electrode outputting a k-th gate signal; a second output transistor including a gate electrode receiving the output control signal of the first node, an source electrode receiving the clock signal, and an drain electrode outputting a k-th carry signal; and a control unit outputting the output control signal to the first node in response to the clock signal, a (k−1)-th carry signal output from a (k−1)-th stage, and a (k+1)-th carry signal output from a (k+1)-th stage.

In exemplary embodiments, the k-th (k is a natural number of 2 or more) stage of the plurality of driving stages may further include: a first pull-down unit which is connected between the drain electrode of the first output transistor and a ground terminal, and pulls down the drain electrode of the first output transistor to the ground terminal in response to a discharge control signal of a second node and the (k+1)-th carry signal output from the (k+1)-th stage; and a second pull-down unit which is connected between the drain electrode of the second output transistor and the a ground terminal, and pulls down the drain electrode of the second output transistor to the ground terminal in response to the discharge control signal of the second node and the (k+1)-th carry signal output from the (k+1)-th stage, wherein the control unit may further output the discharge control signal to the second node.

In exemplary embodiments, the dummy driving stage may include: a first output transistor including a gate electrode receiving an output control signal of a first node, an source electrode receiving the clock signal, and an drain electrode outputting a dummy gate signal; a second output transistor including a gate electrode receiving the output control signal of the first node, an source electrode receiving the clock signal, and an drain electrode outputting a dummy carry signal; and a control unit outputting the output control signal to the first node in response to the clock signal, the carry signal output from the last driving stage of the plurality of driving stages, and a carry signal output from any one of the plurality of driving stages.

In exemplary embodiments, the dummy driving stage may further include: a first pull-down unit which is connected between the drain electrode of the first output transistor and the ground terminal, and pulls down the drain electrode of the first output transistor to the ground terminal in response to a discharge control signal of a second node and a carry signal output from any one of the plurality of driving stages; and a second pull-down unit which is connected between the drain electrode of the second output transistor and the a ground terminal, and pulls down the drain electrode of the second output transistor to the ground terminal in response to the discharge control signal of the second node and a carry signal output from any one of the plurality of driving stages. The control unit may further output the discharge control signal to the second node.

In exemplary embodiments, the first pull-down unit in the dummy driving stage may include: a first pull-down transistor which is connected between the drain electrode of the first output transistor and the ground voltage, and includes a gate electrode connected to the discharge control signal; and a second pull-down transistor which is connected between the drain electrode of the first output transistor and the ground voltage, and includes a gate electrode connected to a carry signal output from any one of the plurality of driving stages.

In exemplary embodiments, the second pull-down unit in the dummy driving stage may include: a third pull-down transistor which is connected between the drain electrode of the second output transistor and the ground voltage, and includes a gate electrode connected to a carry signal output from any one of the plurality of driving stages; and a fourth pull-down transistor which is connected between the drain electrode of the second output transistor and the ground voltage, and includes a gate electrode connected to the discharge control signal.

In exemplary embodiments, the dummy driving stage may further include: a first pull-down unit which is connected between the drain electrode of the first output transistor and the ground voltage, and pulls down the drain electrode of the first output transistor to the ground voltage in response to the discharge control signal of the second node; and a second pull-down unit which is connected between the drain electrode of the second output transistor and the ground voltage, and pulls down the drain electrode of the second output transistor to the ground voltage in response to the discharge control signal of the second node and a carry signal output from any one of the plurality of driving stages. The control unit may further output the discharge control signal to the second node.

In exemplary embodiments, the first pull-down unit in the dummy driving stage may include: a first pull-down transistor which is connected between the drain electrode of the first output transistor and the ground voltage, and includes a gate electrode connected to the discharge control signal; and a second pull-down transistor which is connected between the drain electrode of the first output transistor and the ground voltage, and includes a gate electrode connected to the discharge control signal.

In exemplary embodiments, the second pull-down unit in the dummy driving stage may include: a third pull-down transistor which is connected between the drain electrode of the second output transistor and the ground voltage, and includes a gate electrode connected to a carry signal output from any one of the plurality of driving stages; and a fourth pull-down transistor which is connected between the drain electrode of the second output transistor and the ground voltage, and includes a gate electrode connected to the discharge control signal.

Other exemplary embodiments of the inventive concept provide display devices including: a display panel including a plurality of pixels connected to a plurality of gate lines and a plurality of data lines, respectively; a data driving circuit for driving the data lines; a gate driving circuit outputting a plurality of gate signals for driving the plurality of gate lines in response to a clock signal and a vertical start signal; and a driving controller providing the gate driving circuit with the clock signal and the vertical start signal. The gate driving circuit includes: a plurality of driving stages which correspond to the plurality of gate lines, respectively, and each of which outputs a carry signal and a gate signal for driving a corresponding gate line in response to the clock signal, an input signal, and a carry signal of a next stage; and a dummy driving stage which outputs a dummy carry signal in response to the clock signal, a carry signal of the last stage of the plurality of driving stages, and a carry signal output from any one of the plurality of driving stages.

In exemplary embodiments, the input signal provided to the plurality of stages may be a carry signal output from a previous stage, and the input signal provided to a first stage of the plurality of driving stages may be the vertical start signal.

In exemplary embodiments, the carry signal of a next stage provided to the last stage of the plurality of driving stages may be the dummy carry signal output from the dummy driving stage.

In exemplary embodiments, when the number of the plurality of driving stages is n (n is a positive integer), the dummy stage may output the dummy carry signal in response to the clock signal, the carry signal of the last stage of the plurality of stages, and a carry signal output from an (n−1)-th driving stage.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the inventive concept. In the drawings.

DETAILED DESCRIPTION OF THE EMBODIMENTS

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Hereinafter, the inventive concept will be described in detail with reference to the accompanying drawings.

Figure 1:
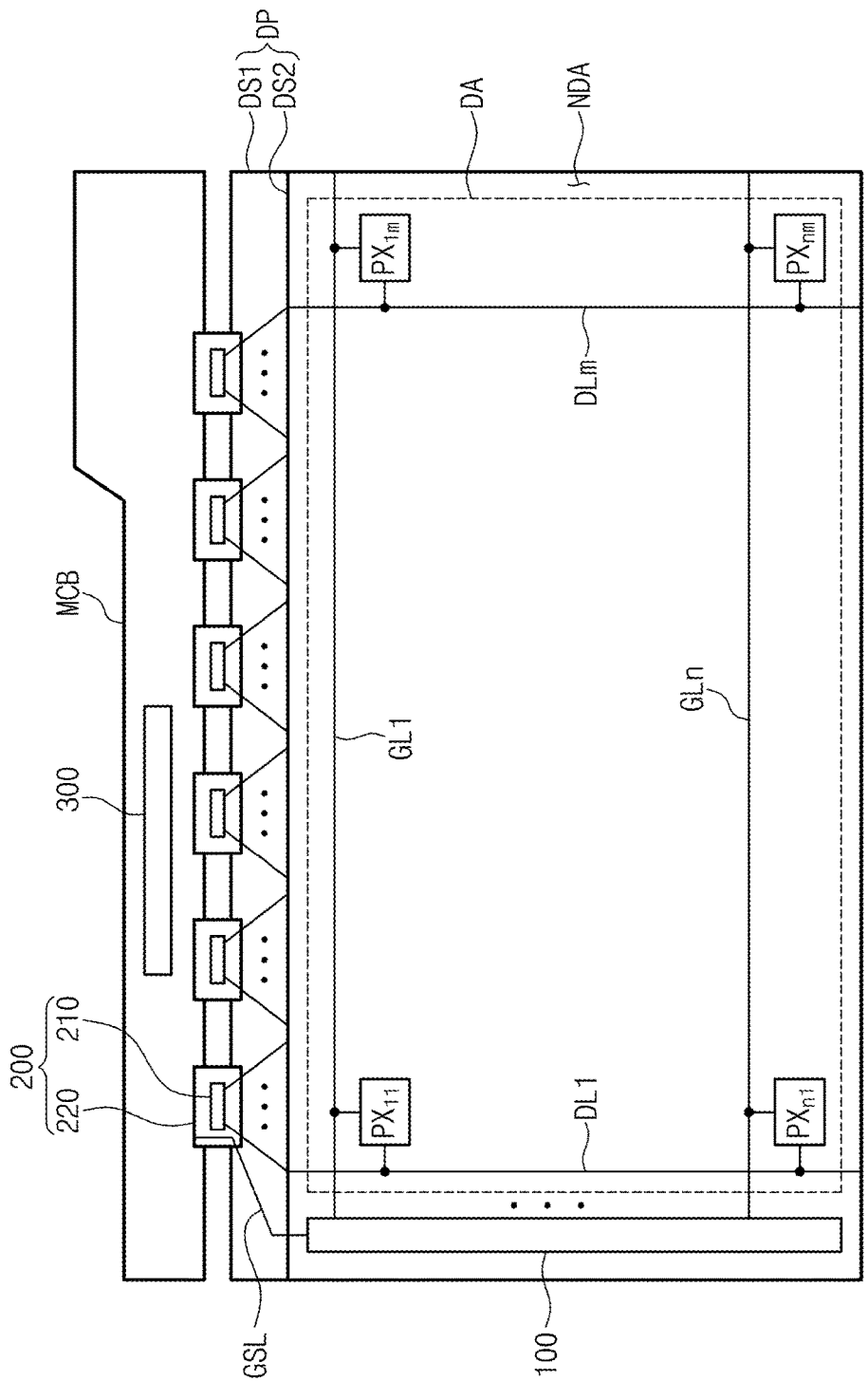
FIG. 1 is a plan view of a display device according to an embodiment of the inventive concept.
Figure 2:
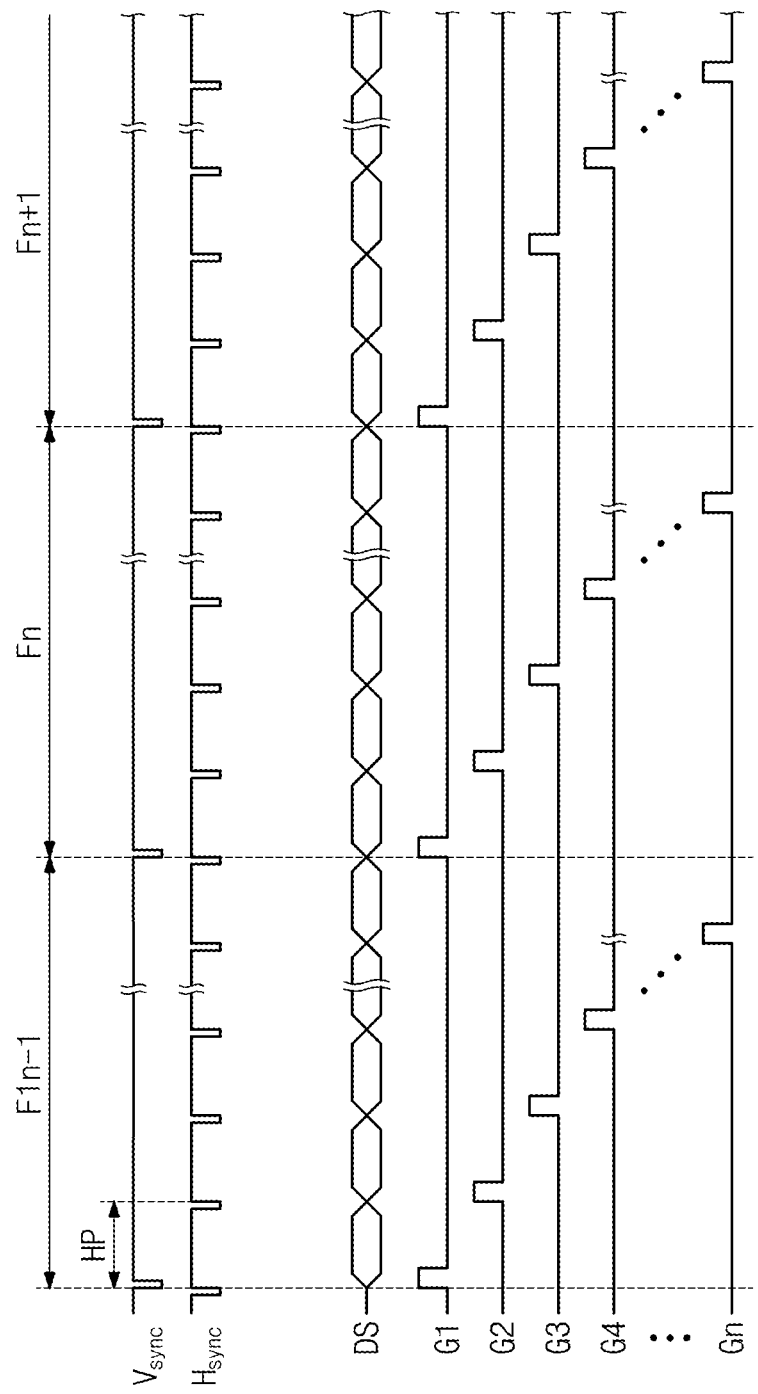
FIG. 2 is a timing diagram of signals of a display device according to an embodiment of the inventive concept.

FIG. 1 is a plan view of a display device according to an embodiment of the inventive concept. FIG. 2 is a timing diagram of signals of a display device according to an embodiment of the inventive concept.

As illustrated in FIGS. 1 and 2, a display device according to an embodiment of the inventive concept includes a display panel DP, a gate driving circuit 100, a data driving circuit 200, and a driving controller 300.

The display panel DP may include, but is not limited to, a variety of display panels such as a liquid crystal display panel, an organic light emitting display panel, an electrophoretic display panel, and an electrowetting display panel. In embodiments of the inventive concept, the display panel DP is described as a liquid crystal display panel. In addition, a liquid crystal display device including the liquid crystal display panel may further include a polarizer, a backlight unit, and the like which are not illustrated.

The display panel DP includes a first substrate DS1, a second substrate DS2 spaced apart from the first substrate DS1, and a liquid crystal layer LCL disposed between the first and second substrates DS1 and DS2. Seen from the plane view, the display panel DP includes a display region DA on which a plurality of pixels $PX_{11}$ to $PX_{nm}$ are disposed and a non-display region NDA surrounding the display region DA.

The display panel DP includes a plurality of gate lines GL1 to GLn disposed on the first substrate DS1 and a plurality of data lines DL1 to DLm which intersect with the gate lines GL1 to GLn. The plurality of gate lines GL1 to GLn are connected to the gate driving circuit 100. The plurality of data lines DL1 to DLm are connected to the data driving circuit 200. In FIG. 1, only some of the plurality of gate lines GL1 to GLn and some of the plurality of data lines DL1 to DLm are illustrated.

In FIG. 1, only some of the plurality of pixels $PX_{11}$ to $PX_{nm}$ are illustrated. The plurality of pixels $PX_{11}$ to $PX_{nm}$ are respectively connected to the plurality of gate lines GL1 to GLn and the plurality of data lines DL1 to DLm in one-to-one correspondence.

The plurality of pixels $PX_{11}$ to $PX_{nm}$ may be divided into a plurality of groups according to colors. The plurality of pixels $PX_{11}$ to $PX_{nm}$ may display one of primary colors. The primary colors may include red, green, blue, and white. Alternatively, the primary colors are not limited thereto, but may further include various colors such as yellow, cyan, and magenta.

The gate driving circuit 100 and the data driving circuit 200 receive control signals from the driving controller 300. The driving controller 300 may be mounted on a main circuit board MCB. The driving controller 300 receives image data and control signals from an external graphic controller (not illustrated). The control signals may include a vertical synchronizing signal Vsync for distinguishing frame sections Fn−1, Fn, and Fn+1, a signal for distinguishing horizontal sections HP, that is a horizontal synchronizing signal Hsync for distinguishing rows, a data enable signal having a high level only during data output sections to indicate data input areas, a clock signal, and the like.

The gate driving circuit 100 generates gate signals G1 to Gn based on a control signal (hereinafter, referred to as gate control signal) received from the driving controller 300 via a signal line GSL during the frame sections Fn−1, Fn, and Fn+1, and outputs the gate signals G1 to Gn to the plurality of gate lines GL1 to GLn. The gate signals G1 to Gn may be sequentially output to correspond to the horizontal sections HP. The gate driving circuit 100 may be formed simultaneously with the pixels $PX_{11}$ to $PX_{nm}$ through a thin film process. For example, the gate driving circuit 100 may be embodied as an oxide semiconductor TFT gate driver circuit (OSG) type on the non-display region NDA.

FIG. 1 exemplarily illustrates a gate driving circuit 100 connected to left ends of the plurality of gate lines GL1 to GLn. In an embodiment of the inventive concept, a display device may include two gate driving circuits. One of the two gate driving circuits may be connected to left ends of the plurality of gate lines GL1 to GLn, and the other may be connected to right ends of the plurality of gate lines GL1 to GLn. Alternatively, one of the two gate driving circuits may be connected to odd-numbered gate lines, and the other may be connected to even-numbered gate lines.

The data driving circuit 200 generates gray scale voltages according to image data provided from the driving controller 300, based on a control signal (hereinafter, referred to as data control signal) received from the driving controller 300. The data driving circuit 200 outputs the gray scale voltages to the plurality of data lines DL1 to DLm as data voltages DS.

The data voltages DS may include positive data voltages having positive values with respect to a common voltage, and/or negative data voltages having negative values with respect to the common voltage. During each of the horizontal sections HP, some of the data voltages applied to the data lines DL1 to DLm may have positive polarity, and the others may have negative polarity. The polarity of the data voltages DS may be inverted according to the frame sections Fn−1, Fn, and Fn+1 to prevent degradation of liquid crystal. The data driving circuit 200 may generate data voltages which are inverted at every frame section, in response to an inversion signal.

The data driving circuit 200 may include a driving chip 210 and a flexible circuit board 220 on which the driving chip 210 is mounted. The data driving circuit 200 may include a plurality of driving chips 210 and a flexible circuit board 220. The flexible circuit board 220 electrically connects the main circuit board MCB to the first substrate DS1. The plurality of driving chips 210 provide corresponding data lines of the plurality of data lines DL1 to DLm with corresponding data signals.

FIG. 1 exemplarily illustrates a data driving circuit 200 of a tape carrier package (TCP) type. According to another embodiment of the inventive concept, the data driving circuit 200 may be disposed on the non-display region NDA of the first substrate DS1 by a chip on glass (COG) method.

Figure 3:
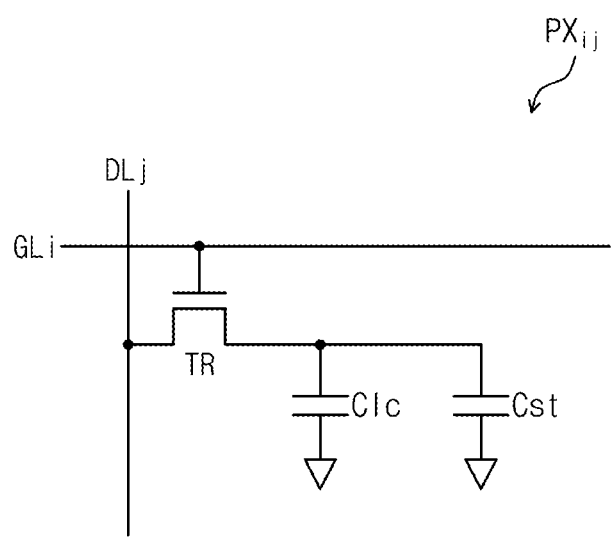
FIG. 3 is an equivalent circuit diagram of a pixel according to an embodiment of the inventive concept.
Figure 4:
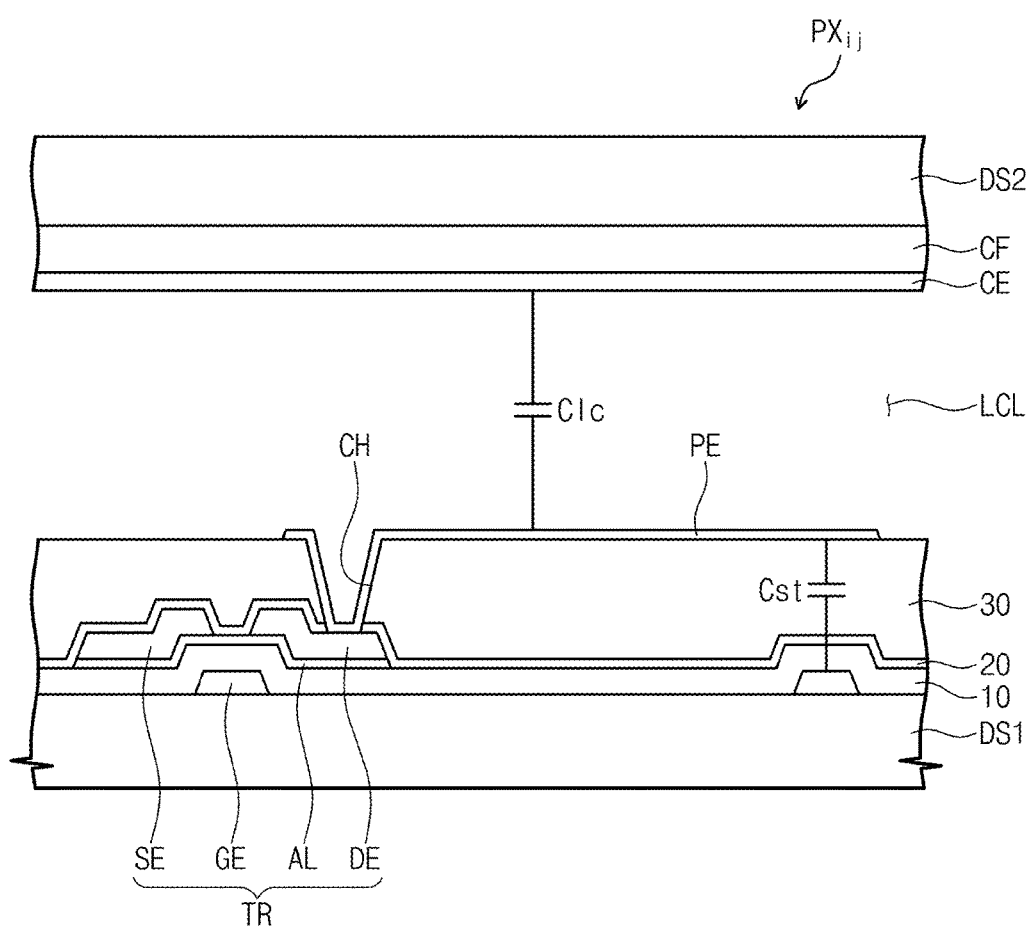
FIG. 4 is a sectional view of a pixel according to an embodiment of the inventive concept.

FIG. 3 is an equivalent circuit diagram of a pixel according to an embodiment of the inventive concept. FIG. 4 is a sectional view of a pixel according to an embodiment of the inventive concept. Each of the plurality of pixels $PX_{11}$ to $PX_{nm}$ in FIG. 1 may have the equivalent circuit in FIG. 3.

As illustrated in FIG. 3, a pixel $PX_{ij}$ includes a pixel thin film transistor TR (hereinafter, referred to as pixel transistor), a liquid crystal capacitor Clc, and a storage capacitor Cst. Hereinafter, the term transistor means a thin film transistor. According to an embodiment of the inventive concept, the storage capacitor Cst may be omitted.

The pixel transistor TR is electrically connected to an i-th gate line GLi and a j-th data line DLj. The pixel transistor TR outputs a pixel voltage corresponding to a data signal received from the j-th data line DLj in response to a gate signal received from the i-th gate line GLi.

The liquid crystal capacitor Clc charges the pixel voltage output from the pixel transistor TR. The alignment of liquid crystal directors included in the liquid crystal layer LCL (see FIG. 4) varies depending on the charge amount charged in the liquid crystal capacitor Clc. Incident light passes through or is blocked by the liquid crystal layer depending on the alignment of the liquid crystal directors.

The storage capacitor Cst is connected in parallel to the liquid crystal capacitor Clc. The storage capacitor Cst maintains the alignment of the liquid crystal directors for a certain period of time.

As illustrated in FIG. 4, the pixel transistor TR includes a gate electrode GE connected to the i-th gate line GLi (see FIG. 3), an active layer AL overlapping the gate electrode GE, an source electrode SE connected to the j-th data line DLj (see FIG. 3), and an drain electrode DE spaced apart from the source electrode SE.

The liquid crystal capacitor Clc includes a pixel electrode PE and a common electrode CE. The storage capacitor Cst includes the pixel electrode PE and a portion of a storage line STL overlapping the pixel electrode PE.

The i-th gate line GLi and the storage line STL are disposed on one surface of the first substrate DS1. The gate electrode GE is branched from the i-th gate line GLi. The i-th gate line GLi and the storage line STL may, for example, include a metal such as aluminum (Al), silver (Ag), copper (Cu), molybdenum (Mo), chromium (Cr), tantalum (Ta), and titanium (Ti), or alloys thereof. The i-th gate line GLi and the storage line STL may include a multi-layered structure, for example both a titanium layer and a copper layer.

A first dielectric layer 10 covering the gate electrode GE and the storage line STL is disposed on one surface of the first substrate DS1. The first dielectric layer 10 may include at least any one of inorganic and organic materials. The first dielectric layer 10 may be an organic layer or an inorganic layer. The first dielectric layer 10 may include a multi-layered structure, for example both a silicon nitride layer and a silicon oxide layer.

The active layer AL overlapping the gate electrode GE is disposed on the first dielectric layer 10. The active layer AL may include a semiconductor layer and an ohmic contact layer. The semiconductor layer is disposed on the first dielectric layer 10, and the ohmic contact layer is disposed on the semiconductor layer.

The drain electrode DE and the source electrode SE are disposed on the active layer AL. The drain electrode DE and the source electrode SE are spaced apart from each other. The drain electrode DE and the source electrode SE each partially overlaps the gate electrode GE.

A second dielectric layer 20 covering the active layer AL, the drain electrode DE, and the source electrode SE is disposed on the first dielectric layer 10. The second dielectric layer 20 may include at least any one of inorganic and organic materials. The second dielectric layer 20 may be an organic layer or an inorganic layer. The second dielectric layer 20 may include a multi-layered structure, for example both a silicon nitride layer and a silicon oxide layer.

FIG. 4 exemplarily illustrates a pixel transistor TR having a stagger structure, but the structure of the pixel transistor TR is not limited thereto. The pixel transistor TR may also have a planar structure.

A third dielectric layer 30 is disposed on the second dielectric layer 20. The third dielectric layer 30 provides a planar surface. The third dielectric layer 30 may include an organic material.

The pixel electrode PE is disposed on the third dielectric layer 30. The pixel electrode PE is connected to the drain electrode DE via a contact hole CH passing through the second and third dielectric layers 20 and 30. An alignment layer (not illustrated) covering the pixel electrode PE may be disposed on the third dielectric layer 30.

A color filter layer CF is disposed on one surface of the second substrate DS2. The common electrode CE is disposed on the color filter layer CF. A common voltage is applied to the common electrode CE. The common voltage has a different value from the pixel voltage. An alignment layer (not illustrated) covering the common electrode CE may be disposed on the common electrode CE. Another dielectric layer may be disposed between the color filter CF and the common electrode CE.

The pixel electrode PE and the common electrode CE with the liquid crystal layer LCL disposed therebetween form the liquid crystal capacitor Clc. Furthermore, the pixel electrode PE and a portion of the storage line STL with the first, second, and third dielectric layers 10, 20, and 30 disposed therebetween form the storage capacitor Cst. The storage line STL receives a storage voltage having a different value from the pixel voltage. The storage voltage may be equal to the common voltage.

Meanwhile, the cross section of the pixel $PX_{ij}$ in FIG. 4 is only one example. Unlike in FIG. 4, at least any one of the color filter layer CF and the common electrode CE may be disposed on the first substrate DS1. In other words, the liquid crystal display panel according to an embodiment of the inventive concept may include pixels in, for example, a vertical alignment (VA) mode, a patterned vertical alignment (PVA) mode, an in-plane switching (IPS) mode or a fringe-field switching (FFS) mode, and a plane to line switching (PLS) mode.

Figure 5:
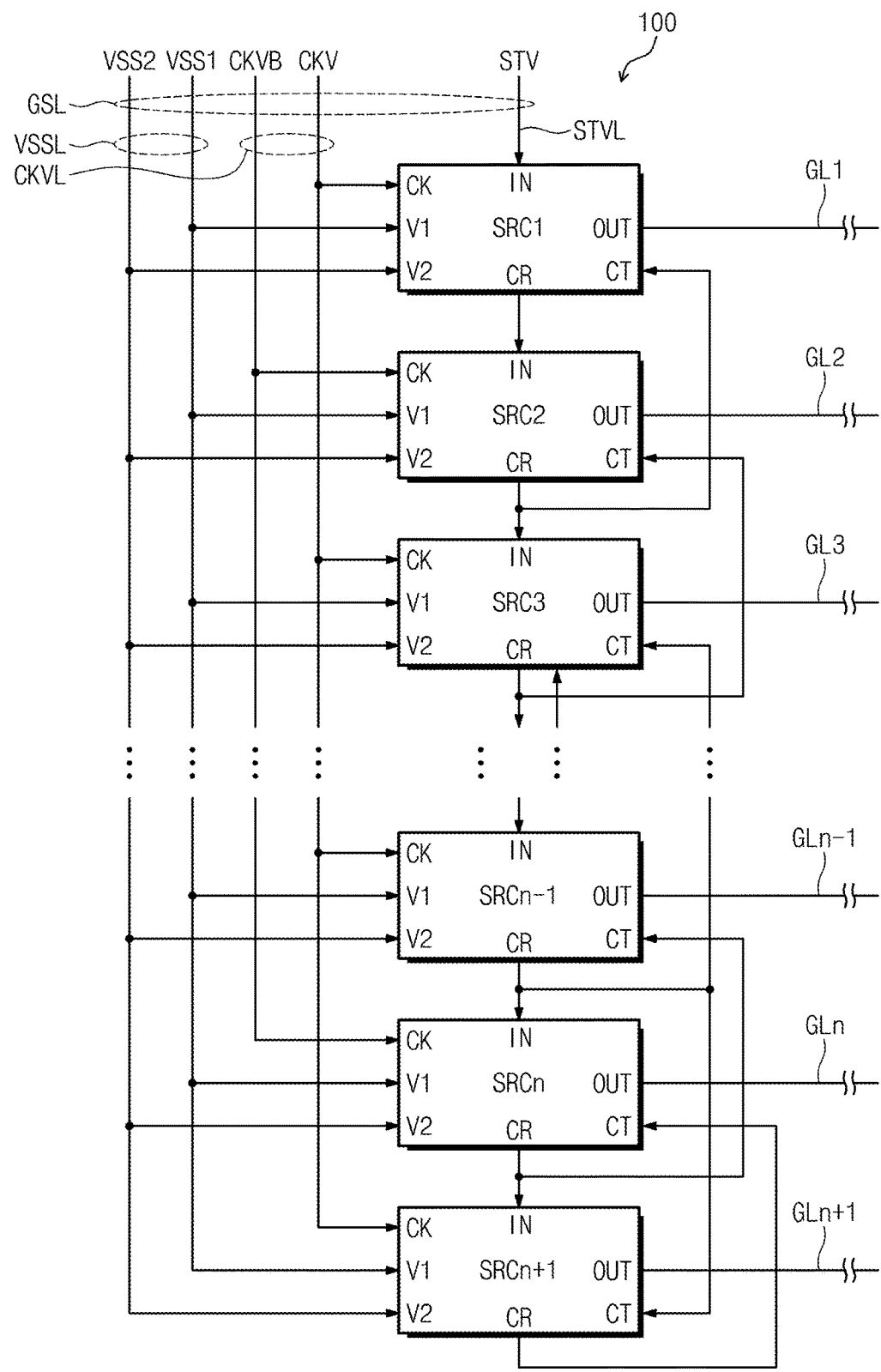
FIG. 5 is a block diagram of a gate driving circuit according to an embodiment of the inventive concept.

FIG. 5 is a block diagram of a gate driving circuit according to an embodiment of the inventive concept. As illustrated in FIG. 5, the gate driving circuit 100 includes a plurality of driving stages SRC1 to SRCn and a dummy driving stage SRCn+1. The plurality of driving stages SRC1 to SRCn have a cascade connection such that each of the driving stages operates in response to a carry signal output from a previous driving stage and a next carry signal output from a next stage.

Each of the plurality of driving stages SRC1 to SRCn receives a first clock signal CKV/a second clock signal CKVB, a first ground voltage VSS1, a second ground voltage VSS2, and a back bias control voltage VBB (not shown) from the driving controller 300 in FIG. 1 via the signal line GSL. The first ground voltage VSS1 and the second ground voltage VSS2 may be different voltages. The first ground voltage VSS1 and the second ground voltage VSS2 may be a same voltage. The driving stage SRC1 receives a vertical start signal STV. The signal line GSL includes ground voltage lines VSSL for transferring the first and second ground voltages VSS1 and VSS2, clock signal lines CKVL for transferring the first and second clock signals CKV and CKVB, and a vertical start signal line STVL for transferring the vertical start signal STV.

In this embodiment, the plurality of driving stages SRC1 to SRCn are connected to the plurality of gate lines GL1 to GLn, respectively. The plurality of driving stages SRC1 to SRCn provide the plurality of gate lines GL1 to GLn with gate signals, respectively. According to an embodiment of the inventive concept, the gate lines connected to the plurality of driving stages SRC1 to SRCn may be odd-numbered gate lines or even-numbered gate lines of the total gate lines.

The plurality of driving stages SRC1 to SRCn and the dummy driving stage SRCn+1 each includes an output terminal OUT, a carry terminal CR, an input terminal IN, a control terminal CT, a clock terminal CK, a first ground terminal V1, a second ground terminal V2, and a bias voltage terminal VB.

Output terminals OUT of the plurality of driving stages SRC1 to SRCn are respectively connected to the plurality of gate lines GL1 to GLn in one-to-one correspondence. The gate signals generated from the plurality of driving stages SRC1 to SRCn are respectively provided to the plurality of gate lines GL1 to GLn via the output terminals OUT.

The carry terminal CR of one of the plurality of driving stages SRC1 to SRCn is electrically connected to an input terminal IN of a driving stage next to the one driving stage. The carry terminal CR of each of the plurality of driving stages SRC1 to SRCn outputs a carry signal.

The input terminal IN of one of the plurality of driving stages SRC1 to SRCn and the dummy driving stage SRCn+1 receives a carry signal of a driving stage prior to the one driving stage. For example, an input terminal IN of a third driving stage SRC3 receives a carry signal of a second driving stage SRC2. An input terminal IN of the first driving stage SRC1 of the plurality of driving stages SRC1 to SRCn receives the vertical start signal STV for starting the driving of the gate driving circuit 100 instead of a carry signal of a previous driving stage.

The control terminal CT of one of the plurality of driving stages SRC1 to SRCn is electrically connected to a carry terminal of a driving stage next to the one driving stage. The control terminal CT of one of the plurality of driving stages SRC1 to SRCn receives a carry signal of a driving stage next to the one driving stage. For example, a control terminal CT of the second driving stage SRC2 receives a carry signal output from a carry terminal CR of the third driving stage SRC3. According to another embodiment of the inventive concept, the control terminal CT of one of the plurality of driving stages SRC1 to SRCn may also be electrically connected to an output terminal OUT of a driving stage next to the one driving stage.

A control terminal CT of the driving stage SRCn disposed at the end receives a carry signal output from a carry terminal CR of the dummy driving stage SRCn+1. A control terminal CT of the dummy driving stage SRCn+1 receives a carry signal CRn−1 output from a carry terminal CR of a previous driving stage SRCn−1 instead of the vertical start signal STV. Unlike the ground voltage lines VSSL and the clock signal lines CKVL, the vertical start signal line STVL transferring the vertical start signal STV extends only up to the first driving stage SRC1. Since the signal line GSL aligned adjacent to the driving stages SRC1 to SRCn does not include the vertical start signal STVL, the circuit area of the gate driving circuit 100 may be reduced. As the circuit area of the gate driving circuit 100 decreases, the area of the non-display region NDA of the display panel DP in FIG. 1 may be reduced. Furthermore, since the signal line GSL aligned adjacent to the driving stages SRC1 to SRCn does not include the vertical start signal STVL, capacitance interference between adjacent wirings may be reduced.

Referring to FIG. 5 again, the clock terminal CK of each of the plurality of driving stages SRC1 to SRCn receives any one of the first and second clock signals CKV and CKVB. Each of clock terminals CK of odd-numbered driving stages SRC1 and SRC3 of the plurality of driving stages SRC1 to SRCn may receive the first clock signal CKV. Each of clock terminals CK of even-numbered driving stages SRC2 and SRCn of the plurality of driving stages SRC1 to SRCn may receive the second clock signal CKVB. The first clock signal CKV and the second clock signal CKVB may have different phases.

The first ground terminal V1 of each of the plurality of driving stages SRC1 to SRCn and the dummy driving stage SRCn+1 receives the first ground voltage VSS1. The second ground terminal V2 of each of the plurality of driving stages SRC1 to SRCn and the dummy driving stage SRCn+1 receives the second ground voltage VSS2. The first ground voltage VSS1 and the second ground voltage VSS2 have different voltage levels, and the second ground voltage VSS2 has a lower level than the first ground voltage VSS1.

The bias voltage terminal VB (not shown) of each of the plurality of driving stages SRC1 to SRCn receives the back bias control voltage VBB. The back bias control voltage VBB will be described later in detail.

According to an embodiment of the inventive concept, each of the plurality of driving stages SRC1 to SRCn may not include any one of the output terminal OUT, the input terminal IN, the carry terminal CR, the control terminal CT, the clock terminal CK, the first ground terminal V1, and the second ground terminal V2, or may further include other terminals. For example, any one of the first and second ground terminals V1 and V2 may be omitted. In this case, each of the plurality of driving stages SRC1 to SRCn receives only any one of the first and second ground voltages VSS1 and VSS2. Furthermore, the connection structure of the plurality of driving stages SRC1 to SRCn may be modified.

Figure 6:
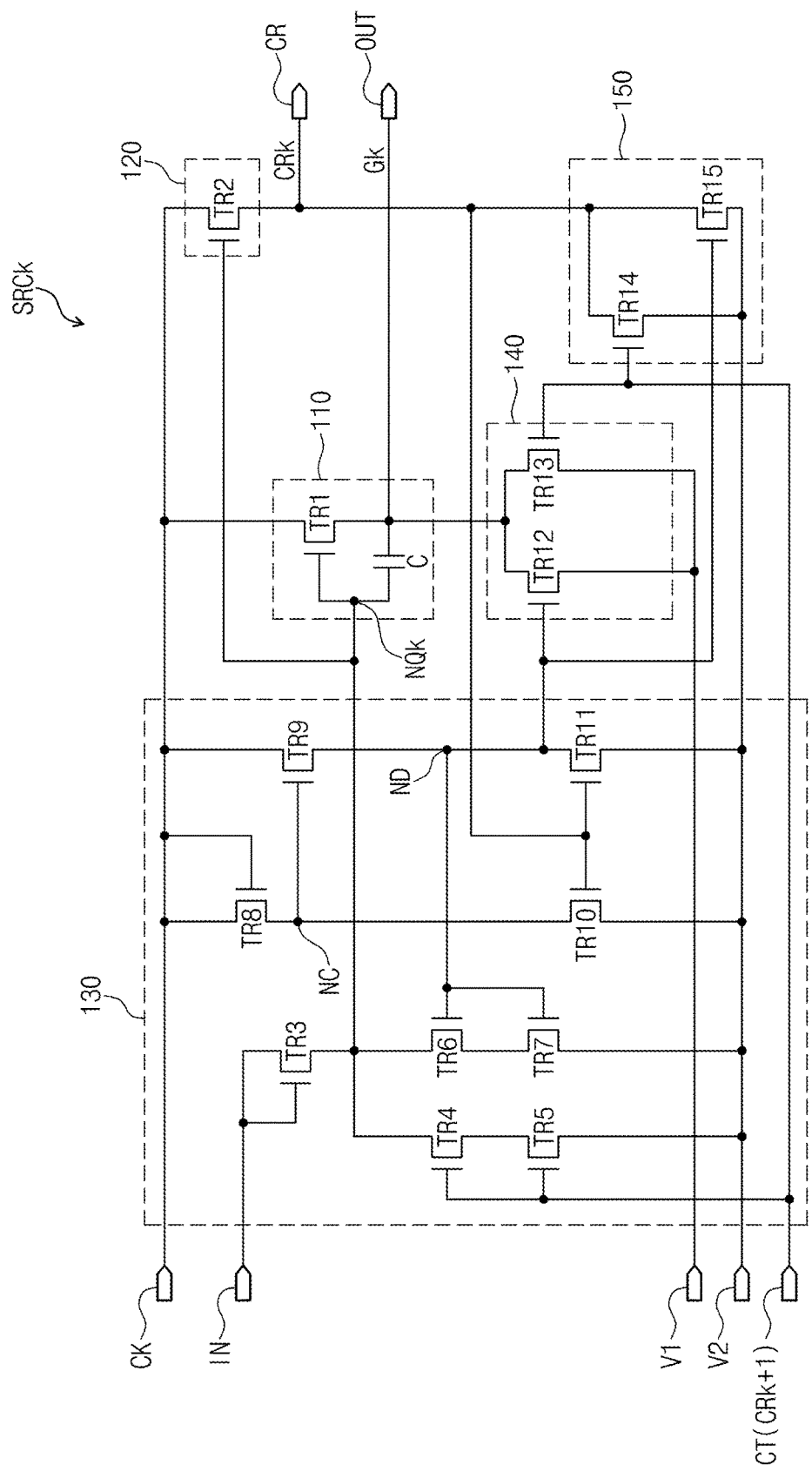
FIG. 6 is a circuit diagram of a driving stage according to an embodiment of the inventive concept.

FIG. 6 is a circuit diagram of a driving stage according to an embodiment of the inventive concept.

FIG. 6 exemplarily illustrates a k-th (k is a positive integer) driving stage SRCk of the plurality of driving stages SRC1 to SRCn in FIG. 5. Each of the plurality of driving stages SRC1 to SRCn in FIG. 5 may have the same circuit as the k-th driving stage SRCk.

Referring to FIG. 6, the k-th driving stage SRCk includes a first output unit 110, a second output unit 120, a control unit 130, and first and second pull-down units 140 and 150. The first output unit 110 outputs a k-th gate signal Gk, and the second output unit 120 outputs a k-th carry signal CRk. The first pull-down unit 140 pulls down the output terminal OUT to the first ground voltage VSS1 connected to the first ground terminal V1. The second pull-down unit 150 pulls down the carry terminal CR to the second ground voltage VSS2 connected to the second ground terminal V2. The control unit 130 controls operations of the first and second output units 110 and 120, and the first and second pull-down units 140 and 150.

A specific configuration of the k-th driving stage SRCk is as follows.

The first output unit 110 includes a first output transistor TR1. The first output transistor TR1 includes an source electrode connected to a clock terminal CK, a gate electrode connected to a first node NQk, and an drain electrode outputting the k-th gate signal Gk. A capacitor C is connected between the first node NQk and the drain electrode of the first output transistor TR1.

The second output unit 120 includes a second output transistor TR2. The second output transistor TR2 includes an source electrode connected to the clock terminal CK, a gate electrode connected to the first node NQk, and an drain electrode outputting the k-th carry signal CRk.

As illustrated in FIG. 5 above, clock terminals CK of some driving stages SRC1, SRC3, . . . , SRCn−1 of the driving stages SRC1 to SRCn and the dummy driving stage SRCn+1 receive the first clock signal CKV. Clock terminals CK of the other driving stages SRC2, SRC4, SRCn of the driving stages SRC1 to SRCn receive the second clock signal CKVB. The first and second clock signals CKV and CKVB are complementary to each other. That is, the first clock signal CKV and the second clock signal CKVB may have a phase difference of 180° from each other.

The control unit 130 turns on the first and second output transistors TR1 and TR2 in response to a (k−1)-th carry signal CRk−1 received from a previous driving stage SRCk−1 via an input terminal IN. The control unit 130 turns off the first and second output transistors TR1 and TR2 in response to a (k+1)-th carry signal CRk+1 received from a next driving stage SRCk+1 via a control terminal CT. Furthermore, the control unit 130 controls the first and second pull-down units 140 and 150 in response to the first or second clock signals CKV or CKVB received via the clock terminal CK and the (k+1)-th carry signal CRk+1 received via the control terminal CT.

The control unit 130 includes third to eleventh transistors TR3 to TR11. The third transistor TR3 is connected between the input terminal IN and the first node NQk, and includes a gate electrode connected to the input terminal IN. Fourth and fifth transistors TR4 and TR5 are sequentially connected between the first node NQk and the second ground terminal V2, and respectively include control electrodes connected to the control terminal CT.

Sixth and seventh transistors TR6 and TR7 are connected between the first node NQk and the second ground terminal V2, and respectively include control electrodes connected to a discharge control node ND. An eighth transistor TR8 is connected between the clock terminal CK and a control node NC, and includes a gate electrode connected to the clock terminal CK. The ninth transistor TR9 is connected between the clock terminal CK and the discharge control node ND, and includes a gate electrode connected to the control node NC. The tenth transistor TR10 is connected between the control node NC and the second ground terminal V2, and includes a gate electrode connected to the drain electrode of the second output transistor TR2. An eleventh transistor TR11 is connected between the discharge control node ND and the second ground terminal V2, and includes a gate electrode connected to the drain electrode of the second output transistor TR2.

The first pull-down unit 140 includes first and second pull-down transistors TR12 and TR13. The first pull-down transistor TR12 is connected between the drain electrode of the first output transistor TR1 and the first ground terminal V1, and includes a gate electrode connected to the discharge control node ND. The second pull-down transistor TR13 is connected between the drain electrode of the first output transistor TR1 and the first ground voltage V1, and includes a gate electrode connected to the control terminal CT.

The second pull-down unit 150 includes third and fourth pull-down transistors TR14 and TR15. The third pull-down transistor TR14 is connected between the drain electrode of the second output transistor TR2 and the second ground terminal V2, and includes a gate electrode connected to the control terminal CT. The fourth pull-down transistor TR15 is connected between the drain electrode of the second output transistor TR2 and the second ground terminal V2, and includes a gate electrode connected to the discharge control node ND.

As illustrated in FIG. 5, the control terminal CT of the k-th driving stage SRCk receives the carry signal CRk+1 output from the (k+1)-th driving stage SRCk+1. Therefore, when the carry signal CRk+1 output from the (k+1)-th driving stage SRCk+1 changes its level to a high level, the second pull-down transistor TR13 in the first pull-down unit 140 and the third pull-down transistor TR14 in the second pull-down unit 150 are turned on to discharge the k-th gate signal Gk and the k-th carry signal CRk to the first ground voltage VSS1 and the second ground voltage VSS2, respectively.

Figure 7:
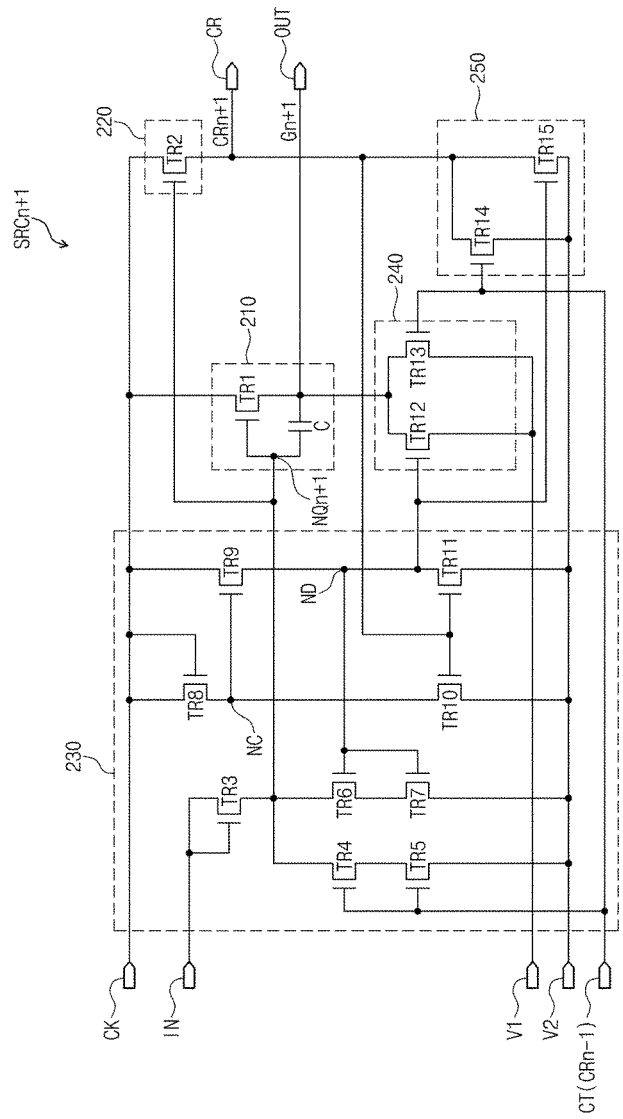
FIG. 7 is a circuit diagram of a dummy driving stage according to an embodiment of the inventive concept.

FIG. 7 is a circuit diagram of a dummy driving stage according to an embodiment of the inventive concept.

The dummy driving stage SRCn+1 in FIG. 7 may have the same circuit as the k-th driving stage in FIG. 6. Therefore, the same reference numerals are used for the same elements as those of the k-th driving stage SRCk, and duplicate description will not be provided herein.

Referring to FIG. 7, the dummy driving stage SRCn+1 includes a first output unit 210, a second output unit 220, a control unit 230, and first and second pull-down units 240 and 250.

Unlike the k-th driving stage SRCk in FIG. 6, the control terminal CT of the dummy driving stage SRCn+1 receives the carry signal CRn−1 output from the previous (n−1)-th stage SRCn−1.

Therefore, when the carry signal CRn−1 output from the (n−1)-th driving stage SRCn−1 changes its level to a high level, the second pull-down transistor TR13 in the first pull-down unit 240 and the third pull-down transistor TR14 in the second pull-down unit 250 are turned on to discharge an (n+1)-th gate signal Gn+1 and an (n+1)-th carry signal CRn+1 to the first ground voltage VSS1 and the second ground voltage VSS2, respectively.

Figure 8:
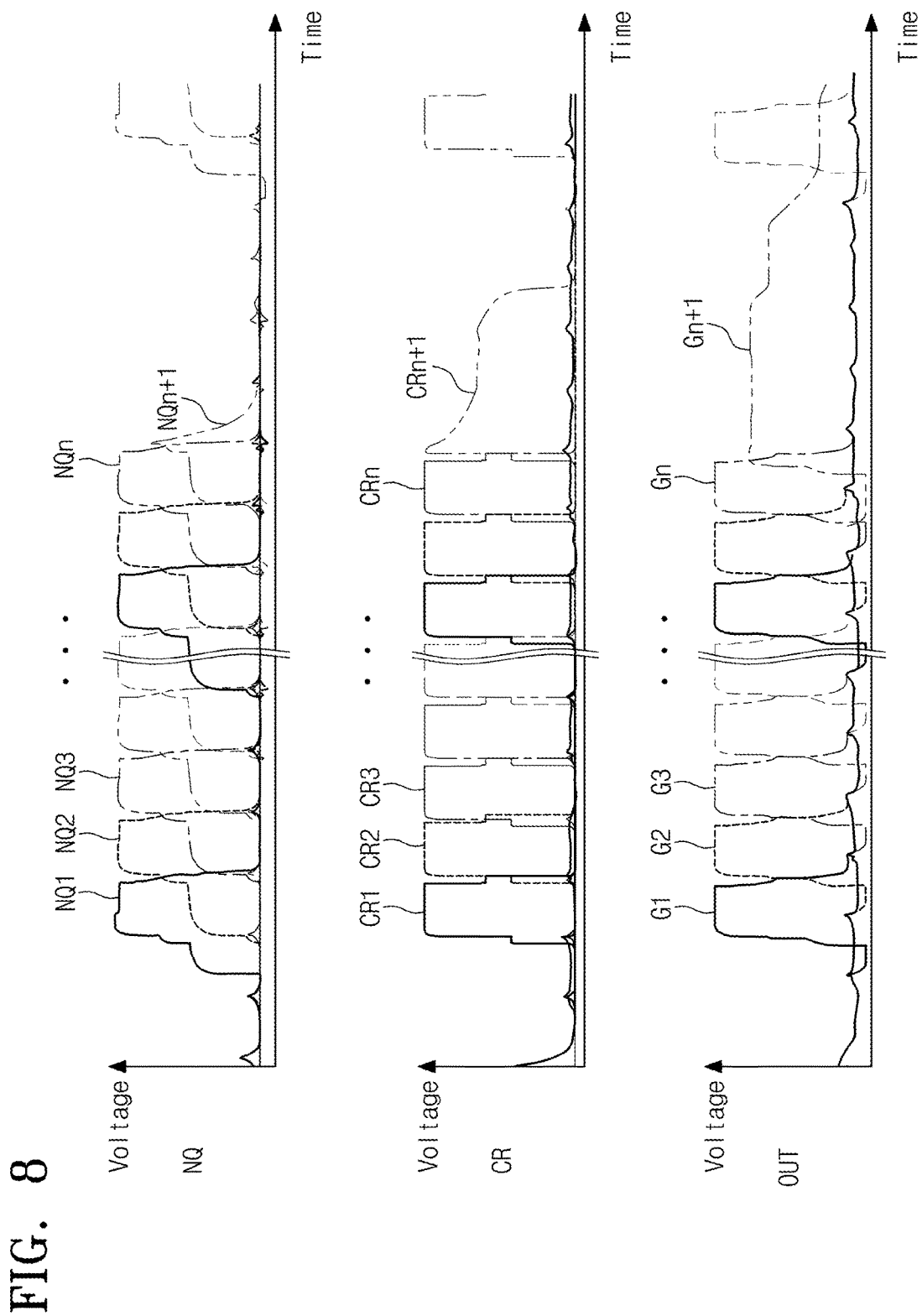
FIG. 8 exemplarily illustrates signals output from first nodes, carry terminals, and output terminals of the driving stages and the dummy driving stage in FIG. 5.

FIG. 8 exemplarily illustrates signals output from first nodes, carry terminals, and output terminals of the driving stages and the dummy driving stage in FIG. 5.

Referring to FIG. 8, it can be seen that carry signals CR1 to CRn and gate signals G1 to Gn, which are output from the driving stages SRC1 to SRCn, are output in a normal state even if the control terminal CT of the dummy driving stage SRCn+1 receives the carry signal CRn−1 output from the previous (n−1)-th stage SRCn−1. However, a discharge time of the dummy gate signal Gn+1 output from the output terminal OUT of the dummy driving stage SRCn+1 becomes longer, but the dummy gate signal Gn+1 does not effect on the image displayed in the display panel DP in FIG. 1.

Figure 9:
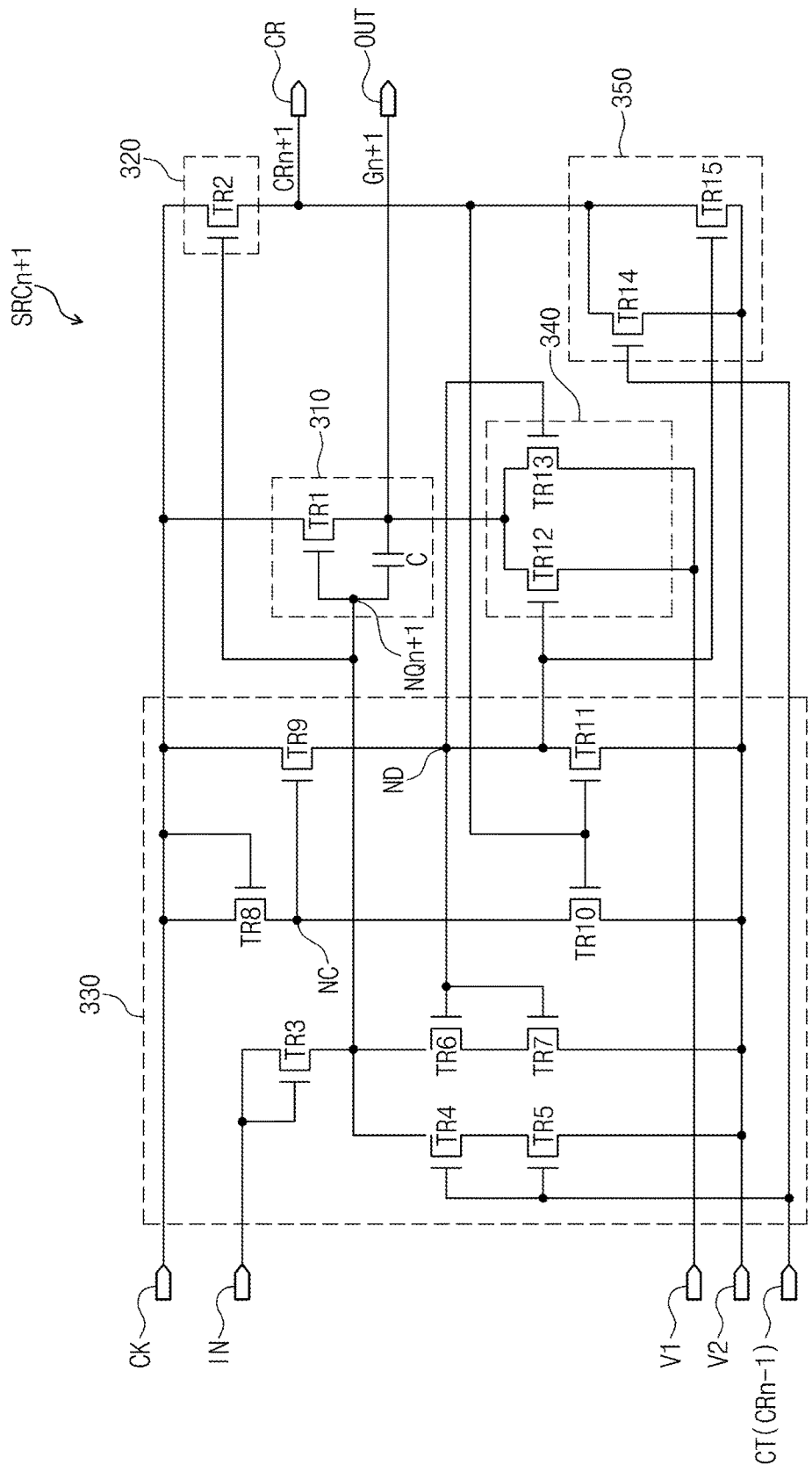
FIG. 9 a circuit diagram of a dummy driving stage according to another embodiment of the inventive concept.

FIG. 9 is a circuit diagram of a dummy driving stage according to another embodiment of the inventive concept.

The dummy driving stage SRCn+1 in FIG. 9 has a similar circuit configuration with the k-th driving stage in FIG. 6. Therefore, the same reference numerals are used for the same elements as those of the k-th driving stage SRCk in FIG. 6, and duplicate description will not be provided herein.

Referring to FIG. 9, the dummy driving stage SRCn+1 includes a first output unit 310, a second output unit 320, a control unit 330, and first and second pull-down units 340 and 350. Unlike the k-th driving stage SRCk in FIG. 6, the control terminal CT of the dummy driving stage SRCn+1 receives the carry signal CRn−1 output from the previous (n−1)-th stage SRCn−1. Furthermore, the gate electrode of the second pull-down transistor TR13 in the first pull-down unit 340 is connected to the discharge control node ND.

Therefore, when the signal of the discharge control node ND changes its level to a high level, the second pull-down transistor TR13 in the first pull-down unit 340 is turned on to discharge the (n+1)-th gate signal Gn+1 to the first ground voltage VSS1. Furthermore, when the carry signal CRn−1 output from the (n−1)-th driving stage SRCn−1 changes its level to a high level, the third pull-down transistor TR14 in the second pull-down unit 350 is turned on to discharge the (n+1)-th carry signal CRn+1 to the second ground voltage VSS2.

Figure 10:
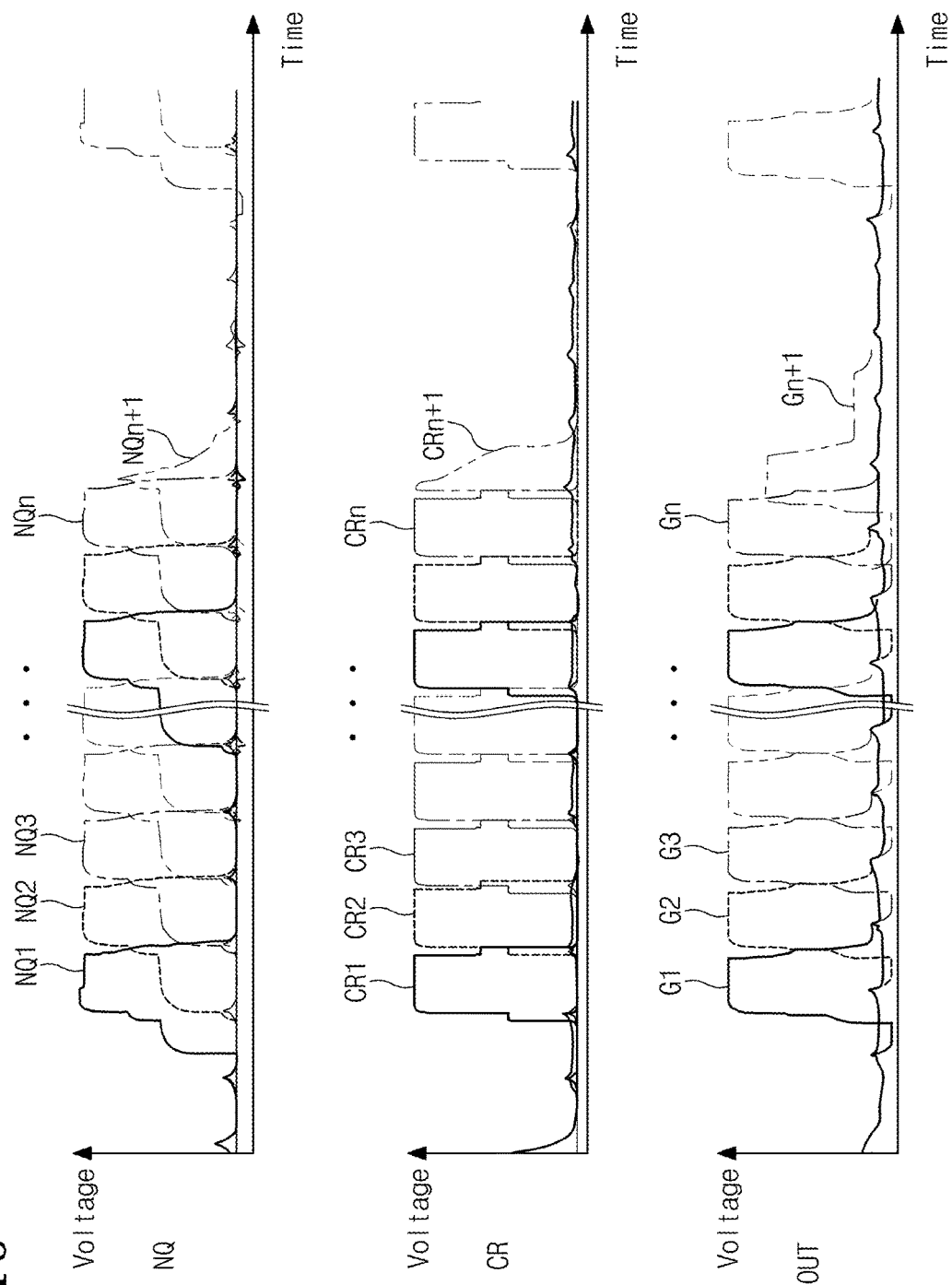
FIG. 10 exemplarily illustrates signals output from first nodes, carry terminals, and output terminals of driving stages and a dummy driving stage when the dummy driving stage of the gate driving circuit in FIG. 5 is configured as the circuit in FIG. 9.

FIG. 10 exemplarily illustrates signals output from first nodes, carry terminals, and output terminals of driving stages and a dummy driving stage when the dummy driving stage of the gate driving circuit in FIG. 5 is configured as the circuit in FIG. 9.

Referring to FIG. 10, it can be seen that the gate electrode of the second pull-down transistor TR13 in the first pull-down unit 340 is connected to the discharge control node ND and the dummy gate signal Gn+1 is thus rapidly discharged.

According to embodiments of the inventive concept, a dummy driving stage may operate in response to a carry signal of a previous driving stage instead of a vertical start signal. Therefore, a signal wiring for providing the dummy driving stage with the vertical start signal is not required in the gate driving circuit. Therefore, the bezel area of a display device may be reduced.

Although the inventive concept has been described with reference to the embodiments, those skilled in the art will appreciate that the present invention can be changed or modified in various ways without departing from the spirit and scope of the present invention described in the appended claims. Furthermore, the embodiments disclosed in the present invention is not intended to limit the inventive concept, but all spirits within the scope and equivalent scope of the appended claims will be construed to be included in the scope of the present invention.

What is claimed is:

1. A gate driving circuit which provides a plurality of gate lines of a display panel with gate signals, the gate driving circuit comprising:
a plurality of driving stages respectively corresponding to the plurality of gate lines wherein each driving stage is configured to output a carry signal and a gate signal for driving a corresponding gate line in response to a clock signal, an input signal, and a carry signal of a next stage; and
a dummy driving stage configured to output a dummy carry signal in response to the clock signal, a carry signal of the last stage of the plurality of driving stages, and a carry signal output from any one of the plurality of driving stages,
wherein the dummy driving stage comprises:
a first output transistor including a gate electrode receiving an output control signal of a first node, an source electrode receiving the clock signal, and an drain electrode outputting a dummy gate signal;
a second output transistor including a gate electrode receiving the output control signal of the first node, an source electrode receiving the clock signal, and an drain electrode outputting a dummy carry signal;
a control unit configured to output the output control signal to the first node in response to the clock signal, the carry signal output from the last driving stage of the plurality of driving stages, and a carry signal output from any one of the plurality of driving stages,
a first pull-down unit which is connected between the drain electrode of the first output transistor and a ground voltage, and pulls down the drain electrode of the first output transistor to the ground voltage in response to a discharge control signal of a second node and a carry signal output from any one of the plurality of driving stages; and
a second pull-down unit which is connected between the drain electrode of the second output transistor and the ground voltage, and pulls down the drain electrode of the second output transistor to the ground voltage in response to the discharge control signal of the second node and a carry signal output from any one of the plurality of driving stages, and
wherein the control unit further outputs the discharge control signal to the second node.

2. The gate driving circuit of claim 1, wherein
the input signal provided to the plurality of stages is a carry signal output from a previous stage, and
the input signal provided to a first stage of the plurality of driving stages is a vertical start signal.

3. The gate driving circuit of claim 2, wherein the carry signal of a next stage provided to the last stage of the plurality of driving stages is the dummy carry signal output from the dummy driving stage.

4. The gate driving circuit of claim 1, wherein the dummy stage outputs the dummy carry signal in response to the clock signal, the carry signal of the last stage of the plurality of stages, and a carry signal output from an (n−1)-th driving stage, when the number of the plurality of driving stages is n (n is a positive integer).

5. The gate driving circuit of claim 1, wherein
a k-th (k is a natural number of 2 or more) stage of the plurality of driving stages comprises:
a first output transistor including a gate electrode receiving an output control signal of a first node, an source electrode receiving the clock signal, and an drain electrode outputting a k-th gate signal;
a second output transistor including a gate electrode receiving the output control signal of the first node, an source electrode receiving the clock signal, and an drain electrode outputting a k-th carry signal; and
a control unit configured to output the output control signal to the first node in response to the clock signal, a (k−1)-th carry signal output from a (k−1)-th stage, and a (k+1)-th carry signal output from a (k+1)-th stage.

6. The gate driving circuit of claim 5, wherein
the k-th (k is a natural number of 2 or more) stage of the plurality of driving stages further comprises:
a first pull-down unit which is connected between the drain electrode of the first output transistor and a ground voltage, and pulls down the drain electrode of the first output transistor to the ground voltage in response to a discharge control signal of a second node and the (k+1)-th carry signal output from the (k+1)-th stage; and
a second pull-down unit which is connected between the drain electrode of the second output transistor and the ground voltage, and pulls down the drain electrode of the second output transistor to the ground voltage in response to the discharge control signal of the second node and the (k+1)-th carry signal output from the (k+1)-th stage,
wherein the control unit further outputs the discharge control signal to the second node.

7. The gate driving circuit of claim 1, wherein
the first pull-down unit in the dummy driving stage comprises:
a first pull-down transistor which is connected between the drain electrode of the first output transistor and the ground voltage, and includes a gate electrode connected to the discharge control signal; and
a second pull-down transistor which is connected between the drain electrode of the first output transistor and the ground voltage, and includes a gate electrode connected to a carry signal output from any one of the plurality of driving stages.

8. The gate driving circuit of claim 1, wherein
the second pull-down unit in the dummy driving stage comprises:
a third pull-down transistor which is connected between the drain electrode of the second output transistor and the ground voltage, and includes a gate electrode connected to a carry signal output from any one of the plurality of driving stages; and
a fourth pull-down transistor which is connected between the drain electrode of the second output transistor and the ground voltage, and includes a gate electrode connected to the discharge control signal.

9. A display device comprising:
a display panel including a plurality of pixels connected to a plurality of gate lines and a plurality of data lines, respectively;
a data driving circuit configured to drive the data lines;

a gate driving circuit configured to output a plurality of gate signals for driving the plurality of gate lines in response to a clock signal and a vertical start signal; and a driving controller configured to provide the gate driving circuit with the clock signal and the vertical start signal, wherein the gate driving circuit includes:

a plurality of driving stages respectively corresponding to the plurality of gate lines, wherein each driving stage is configured to output a carry signal and a gate signal for driving a corresponding gate line in response to the clock signal, an input signal, and a carry signal of a next stage; and a dummy driving stage configured to output a dummy carry signal in response to the clock signal, a carry signal of the last stage of the plurality of driving stages, and a carry signal output from any one of the plurality of driving stages, wherein the dummy driving stage comprises:

a first output transistor including a gate electrode receiving an output control signal of a first node, an source electrode receiving the clock signal, and an drain electrode outputting a dummy gate signal;

a second output transistor including a gate electrode receiving the output control signal of the first node, an source electrode receiving the clock signal, and an drain electrode outputting a dummy carry signal;

a control unit configured to output the output control signal to the first node in response to the clock signal, the carry signal output from the last driving stage of the plurality of driving stages, and a carry signal output from any one of the plurality of driving stages, a first pull-down unit which is connected between the drain electrode of the first output transistor and a ground voltage, and pulls down the drain electrode of the first output transistor to the ground voltage in response to a discharge control signal of a second node and a carry signal output from any one of the plurality of driving stages; and a second pull-down unit which is connected between the drain electrode of the second output transistor and the ground voltage, and pulls down the drain electrode of the second output transistor to the ground voltage in response to the discharge control signal of the second node and a carry signal output from any one of the plurality of driving stages, and wherein the control unit further outputs the discharge control signal to the second node.

10. The display device of claim 9, wherein the input signal provided to the plurality of stages is a carry signal output from a previous stage, and the input signal provided to a first stage of the plurality of driving stages is the vertical start signal.

11. The display device of claim 10, wherein the carry signal of a next stage provided to the last stage of the plurality of driving stages is the dummy carry signal output from the dummy driving stage.

12. The display device of claim 9, wherein the dummy stage outputs the dummy carry signal in response to the clock signal, the carry signal of the last stage of the plurality of stages, and a carry signal output from an (n−1)-th driving stage, when the number of the plurality of driving stages is n (n is a positive integer).

* * * * *